(12) United States Patent
Yamazaki et al.

(10) Patent No.: US 9,443,805 B2
(45) Date of Patent: Sep. 13, 2016

(54) WIRE AND SEMICONDUCTOR DEVICE

(71) Applicant: KABUSHIKI KAISHA TOSHIBA, Minato-ku (JP)

(72) Inventors: Yuichi Yamazaki, Tokyo (JP); Makoto Wada, Kanagawa (JP); Masayuki Kitamura, Kanagawa (JP); Tadashi Sakai, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/717,331

(22) Filed: May 20, 2015

(65) Prior Publication Data

US 2015/0255399 A1 Sep. 10, 2015

Related U.S. Application Data

(62) Division of application No. 13/684,297, filed on Nov. 23, 2012, now Pat. No. 9,131,611.

(30) Foreign Application Priority Data

Nov. 25, 2011 (JP) .................................. 2011-258098

(51) Int. Cl.
*H01L 23/48* (2006.01)
*H01L 23/532* (2006.01)
(Continued)

(52) U.S. Cl.
CPC ......... *H01L 23/53276* (2013.01); *B82Y 10/00* (2013.01); *H05K 1/097* (2013.01); *B82Y 30/00* (2013.01); *B82Y 99/00* (2013.01);
(Continued)

(58) Field of Classification Search
CPC ................. H01L 23/53276; H01L 2924/0002; H01L 23/768238; H01L 21/76843; H05K 1/097; B82Y 30/00; B82Y 99/00; B82Y 10/00; H82Y 30/00
USPC .................................. 257/211, 751, E23.165
See application file for complete search history.

(56) References Cited

U.S. PATENT DOCUMENTS

2006/0125025 A1* 6/2006 Kawashima ........... B82Y 10/00
257/401
2009/0047520 A1 2/2009 Lee et al.
(Continued)

FOREIGN PATENT DOCUMENTS

JP 2010-62333 3/2010
JP 2010-212619 9/2010
(Continued)

OTHER PUBLICATIONS

"Three-Dimensional Stacked Multilayer Graphene"; Tianhua Yu, Chen-Wei Liang, Changdong Kim, Eui-Sang Song, and Bin Yu, Fellow, IEEE; IEEE Electron Device Letters, vol. 32, No. 8, Aug. 2011.*

(Continued)

*Primary Examiner* — Yosef Gebreyesus
(74) *Attorney, Agent, or Firm* — Oblon, McClelland, Maier & Neustadt, L.L.P

(57) ABSTRACT

A wire of an embodiment includes: a substrate; a metal film provided on the substrate; a metal part provided on the metal film; and graphene wires formed on the metal part, wherein the graphene wire is electrically connected to the metal film, and the metal film and the metal part are formed using different metals or alloys from each other.

9 Claims, 18 Drawing Sheets

(51) Int. Cl.
  *H05K 1/09* (2006.01)
  *B82Y 10/00* (2011.01)
  *B82Y 99/00* (2011.01)
  *B82Y 30/00* (2011.01)

(52) U.S. Cl.
  CPC ..... *H01L2924/0002* (2013.01); *Y10S 977/734* (2013.01); *Y10S 977/762* (2013.01)

(56) References Cited

U.S. PATENT DOCUMENTS

| | | |
|---|---|---|
| 2009/0166686 A1 | 7/2009 | Hunt et al. |
| 2009/0174435 A1* | 7/2009 | Stan ................ B82Y 10/00 326/112 |
| 2009/0294759 A1 | 12/2009 | Woo et al. |
| 2010/0212728 A1 | 8/2010 | Hori et al. |
| 2010/0255984 A1 | 10/2010 | Sutter et al. |
| 2010/0314627 A1 | 12/2010 | Sung |
| 2011/0006425 A1 | 1/2011 | Wada et al. |
| 2011/0027162 A1 | 2/2011 | Steiner et al. |
| 2011/0101528 A1 | 5/2011 | Akimoto et al. |
| 2011/0108609 A1 | 5/2011 | Woo et al. |
| 2011/0108978 A1 | 5/2011 | Kim et al. |
| 2011/0166012 A1* | 7/2011 | Yang ................ H01M 4/90 502/159 |
| 2011/0253969 A1* | 10/2011 | Dai ................ B82Y 30/00 257/9 |
| 2012/0080661 A1 | 4/2012 | Saito et al. |
| 2012/0080662 A1 | 4/2012 | Saito et al. |
| 2012/0112164 A1 | 5/2012 | Chu et al. |
| 2012/0228614 A1 | 9/2012 | Kitamura et al. |
| 2012/0230128 A1* | 9/2012 | Sandhu ............ G11C 13/0004 365/189.011 |
| 2013/0130153 A1 | 5/2013 | Suzuki et al. |
| 2013/0217226 A1 | 8/2013 | Kitamura et al. |
| 2014/0290565 A1 | 10/2014 | Kim et al. |

FOREIGN PATENT DOCUMENTS

| | | |
|---|---|---|
| JP | 2011-23420 | 2/2011 |
| JP | 2011-96980 | 5/2011 |

OTHER PUBLICATIONS

High-resolution transmission electron microscopy mapping of nickel and cobalt single-crystalline nanorods inside multiwalled carbon nanotubes and chirality calculations; Pawan K. Tyagi, Abha Misra, Manoj K. Singh, and D. S. Misraa Department of Physics, Indian Institute of Technology Bombay, Mumbai-400076, India; Applied Phs. L. 86, 25311(2005).*

Carbon micro- and nanotubes synthesized by PE-CVD technique: Tube structure and catalytic particles crystallography; N.A. Kiselev a, J.L. Hutchison b,*, A.P. Moravsky c,d, E.V. Rakova a, E.V. Dreval a, C.J.D. Hetherington b, D.N. Zakharov a, J. Sloan b,e, R.O. Loutfy, Science Direct; Carbon 42 (2004) 149-161.*

Xuesong Li et al. "Large-Area Synthesis of High-Quality and Uniform Graphene Films on Copper Foils". www.sciencemag.org, vol. 324, Jun. 5, 2009, pp. 1312-1314.

J. Haas et al. "Why Multilayer Graphene on 4H-SiC(001) Behaves like a Single Sheet of Graphene", Physical Review Letters, PRL 100, Mar. 28, 2008, pp. 125504-1-125504-4.

Sukang Bae et al. "Roll-to-Roll production of 30-inch graphene films for transparent electrodes", Nature Nanotechnology, vol. 5, Aug. 2010, pp. 574-578.

Office Action issued Sep. 17, 2013 in corresponding Japanese Patent Application No. JP 2011-258098 (with English translation).

Japanese Office Action issued Apr. 15, 2014, in Japan Patent Application No. 2011-258098 (with English translation).

* cited by examiner

WIRE AND SEMICONDUCTOR DEVICE

CROSS-REFERENCE TO RELATED APPLICATION

This divisional application is based upon and claims the benefit of priority under 35 U.S.C. §120 from U.S. Ser. No. 13/684,297, filed Nov. 23, 2012, which claims the benefit from prior Japanese Patent Application No. 2011-258098, filed on Nov. 25, 2011; the entire contents of each of which are incorporated herein by reference.

FIELD

Embodiments described herein relate generally to a wire and a semiconductor device.

BACKGROUND

As the wire width and wire height of a metal wire which has been miniaturized and thinned for a leading-edge device are closer to the mean free path of a conduction electron, the increase in electrical resistivity due to electronic interface inelastic scattering becomes more prominent. For example, copper (Cu) used as a low-resistance wire material for a leading-edge device has a mean free path of a conduction electron of approximately 40 nm; as the wire width and wire height get closer to 40 nm, the electrical resistivity increases. Moreover, when the wire width and wire height are at or below the mean free path of a conduction electron, the increase in electrical resistivity becomes more prominent.

Since signal delay (RC delay) in a multilayer wire is a significant factor of deteriorating LSI performance, the increase in wire resistance is preferably suppressed as much as possible; however, the increase in electrical resistivity of a metal wire along with the miniaturization is an inevitable problem, and for solving the problem essentially, an alternative to the wire material is needed. The wire resistance of the metal wire is determined based on the electrical resistivity of the metal and its wire length; therefore, the RC delay is more serious particularly when the wire length is longer.

DETAILED DESCRIPTION

A wire of an embodiment includes: a substrate; a metal film provided on the substrate; a metal part provided on the metal film; and graphene wires formed on the metal part, wherein the graphene wire is electrically connected to the metal film, and the metal film and the metal part are formed using different metals or alloys from each other.

A semiconductor device of an embodiment includes: a semiconductor substrate; a contact layer formed on the semiconductor substrate; a wire layer formed on the contact layer; and a protective layer formed on the wire layer, wherein the wire layer is provided with a trench, a catalyst film is formed in the trench, and graphene wires are provided with the catalyst film.

Embodiments of the invention will be described below with reference to the drawings. Note that the drawings including the illustration of the graphene growth angle are schematic and merely depict embodiments of the present disclosure.

First Embodiment

Figure 1:
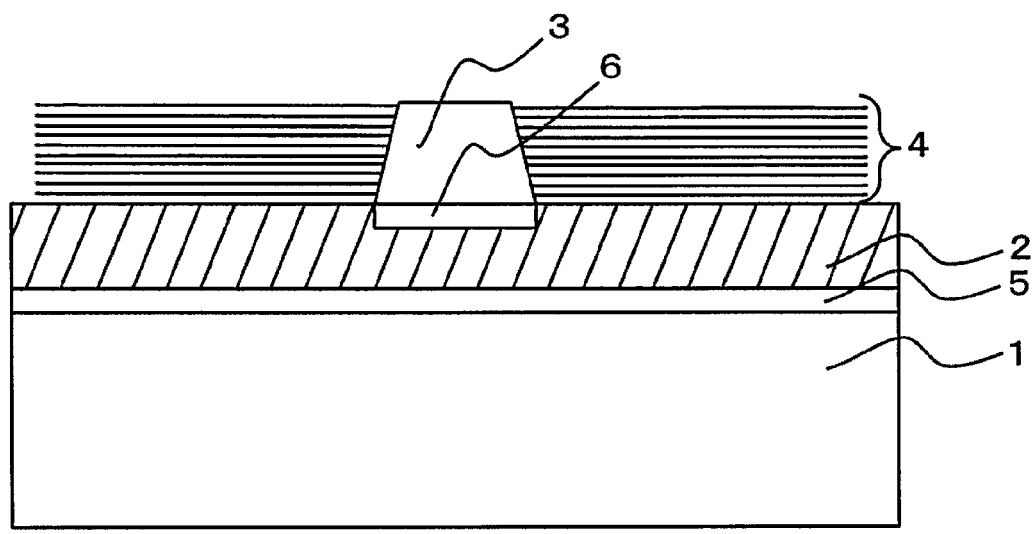
FIG. 1 is a schematic sectional view of a first embodiment.

FIG. 1 is a schematic sectional view of one example of a wire according to an embodiment. A wire according to an embodiment is, for example, a wire of a semiconductor device. The wire of FIG. 1 includes a substrate 1, a first adjustment film 5 provided on the substrate 1, a metal film 2 provided on the first adjustment film 5, a second adjustment film 6 embedded in a surface of a part of the metal film 2, a metal part 3 provided on the second adjustment film 6, and a graphene wire 4 formed on the metal part 3. The graphene wire 4 is electrically connected to the metal film 2. The metal film 2 and the metal part 3 include different metals or alloys from each other.

The substrate is a substrate for a semiconductor device or the like.

The metal film 2 is a metal film that can form single-layer graphene. For allowing the fabrication of single-layer graphene, metal having a crystal structure similar to graphene is preferable. The metal film 2 is preferably a metal film with lower carbon solid solubility than the metal part 3.

Meanwhile, the metal part 3 is a metal film that can form multilayer graphene. For allowing the fabrication of multilayer graphene, the metal part 3 is preferably a metal film with higher carbon solid solubility than the metal film 2. The carbon solid solubility is determined by the amount of carbon solid that is soluble in metal or alloy. High solid solubility of carbon into metal is preferable for fabrication of multilayer graphene. In contrast, low solid solubility of carbon into metal is preferable for fabrication of single-layer graphene. The material suitable for the fabrication of single-layer graphene contributes to area increase of graphene. Large-area graphene contributes to the decrease in resistance of a wire and improvement in reliability because its domain size is also large. When the solid solubility is low, once a first layer of graphene is formed on a metal surface, the supply of carbon to the metal film is stopped, thereby stopping the growth automatically. When the solid solubility is high, even after the first layer of graphene is formed, second and subsequent layers of graphene are formed by carbon much remaining in the metal, so that multilayer graphene is grown easily.

The metal that can form the graphene wire 4 may be metal selected from Cu, Ni, Co, Fe, Ru, Ti, In, Pt, and the like, an alloy including two or more metals selected from the above metal group, or an alloy consisting of two or more metals selected from the above metal group. Above all, Cu and an alloy including Cu are preferable for the use as the metal film 2 from the viewpoints of the above reason and the growth of large-area graphene. The use of Cu as the metal film 2 is more preferable due to the above reason. Moreover, Ni, Co, Fe, and an alloy including any of these are preferable for the use as the metal part 3 due to the above reason. The use of any of Ni, Co, and Fe as the metal part 3 is more preferable due to the above reason. Although the growth of the large-area graphene is difficult, the graphene wire 4 of this embodiment can be fabricated even by using other material than Cu for the metal film 2.

Figure 2:
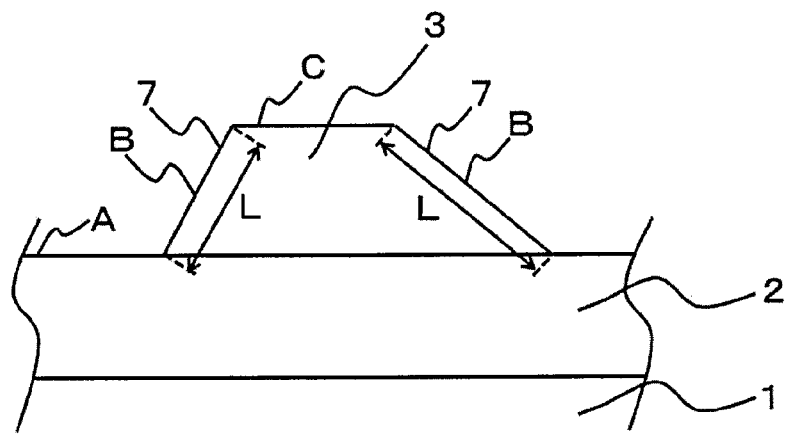
FIG. 2 is a schematic view of a part of a wire of the first embodiment.

FIG. 2 is a schematic view in which a part of the metal film 2 and the metal part 3 are extracted.

The thickness of the metal film 2 is not particularly limited; for example, the thickness thereof is 0.01 µm or more and 0.1 µm or less. The crystal orientation of a plane of the metal film 2 (A-plane in FIG. 2) provided with the graphene wire 4, which is on the side opposite to the substrate side, is preferably (111) plane from the viewpoint of the growth of single-layer graphene.

Planes of the metal part 3 include a facet 7 at which the graphene wire 4 starts to grow. Although the metal part 3 is trapezoidal in FIG. 2, the size and shape and the like of the metal part 3 are not particularly limited as long as the facet 7 is formed. By adjusting the formation direction of the facet 7 of the metal part, a wire having large-area graphene in any direction can be provided. B-plane of the facet 7 in FIG. 2 includes (110) plane and (100) plane where the graphene wire 4 can grow. The length L of the facet 7 in FIG. 2 is preferably 1 nm or more and 100 nm or less. The interlayer distance of the graphene is approximately 0.3 nm. Therefore, the length of this facet 7 corresponds to the length at which the multilayer graphene including approximately two layers or more and 100 layers or 150 layers or less can be formed. By controlling the length of the facet 7, the thickness of the graphene wire 4 serving as a wire can be controlled. C-plane as the top plane of the metal part 3 is preferably (111) plane so that the graphene can easily grow from the facet plane.

Figure 3:
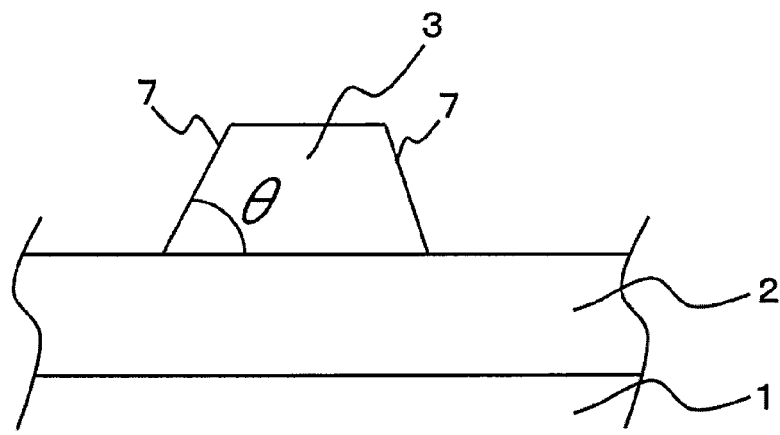
FIG. 3 is a schematic view of a part of a wire of the first embodiment.
Figure 4:
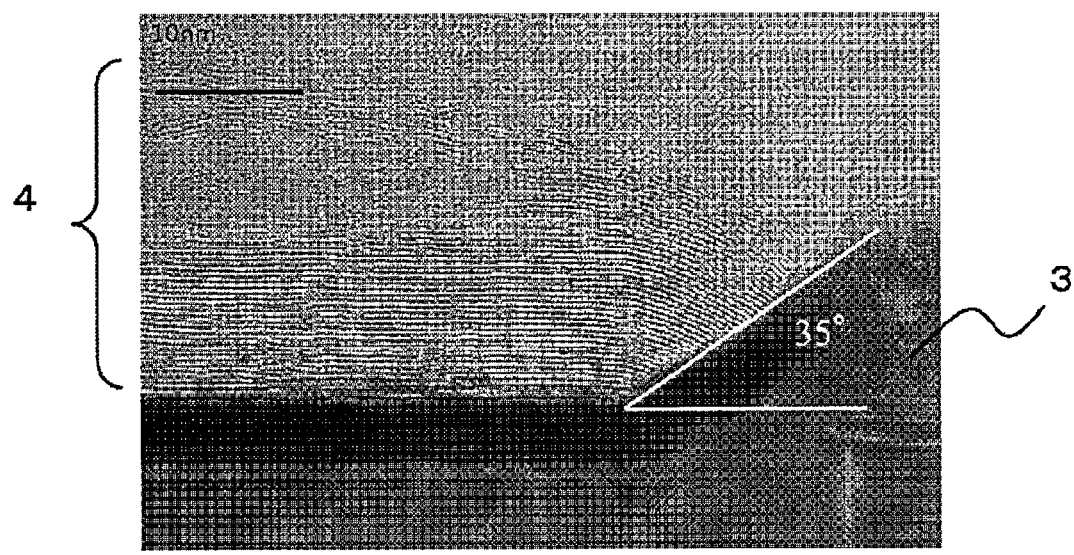
FIG. 4 is a TEM image of a graphene wire.
Figure 5:
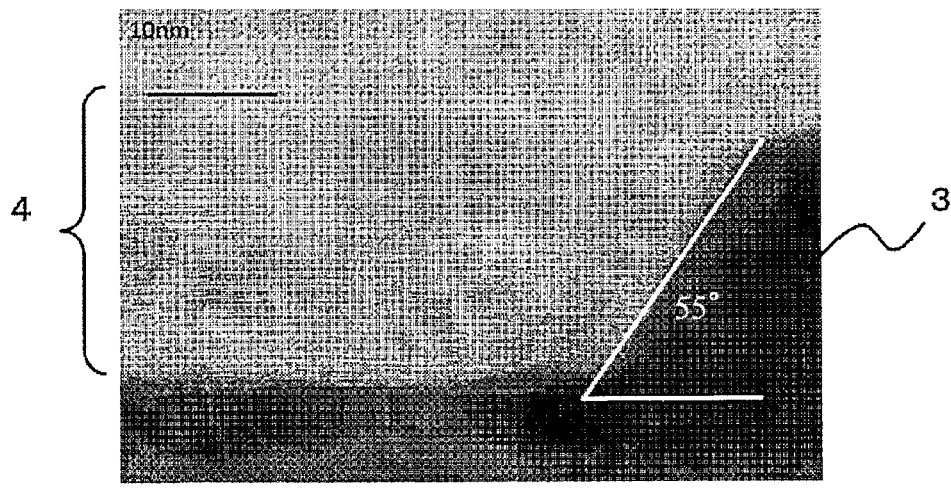
FIG. 5 is a TEM image of a graphene wire.
Figure 6:
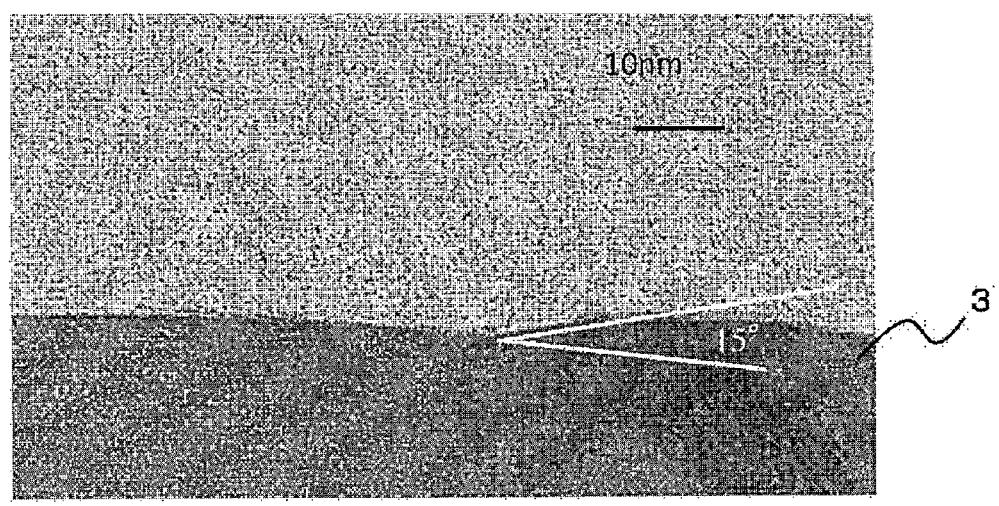
FIG. 6 is a TEM image of a wire.

FIG. 3 is a schematic view in which a part of the metal film 2 and the metal part 3 are extracted. In FIG. 3, θ represents the angle of the facet 7. The angle of the facet 7 is an angle from the surface of the metal film 2 (sharp angle side). When the angle θ of the facet 7 is small, graphene grows to as shown by the TEM (Transmission Electron Microscope) image of FIG. 6, not like image of FIG. 4. For growing the multilayer graphene, the angle θ of the facet 7 is preferably 20° or more and less than 90°. As the TEM images of FIGS. 4 and 5 show, it can be confirmed that the multilayer graphene can grow suitably when the angle of the facet 7 is approximately 35° or approximately 55°.

When the facet 7 has an angle of 35° or 55°, the plane of the facet 7 is likely to be (110) plane or (100) plane as aforementioned. When the angle of the facet 7 includes 35° or 55°, the plane of the facet 7 is likely to include the aforementioned (110) plane or (100) plane. Graphene easily grows even though inclination of ±15° exists from angles of 35° and 55° as the center angle. Based on the knowledge of crystallography, the displacement within 15° from the central angle is caused by crystal dislocation and this is because the crystal plane has excellent conformity. A plane where the angle between the facet and the metal film is 20° or more and 70° or less is preferably included.

Note that the angle of the facet 7 is calculated based on the metal plane 2 or the substrate. As for a method of calculating the angle, collinear approximation is performed on the facet plane and the inclination between the approximate line and the metal film 2 or the substrate is calculated. The inclination values at which the inclination is 20° or more and less than 90° among the obtained inclination values are averaged, and based on the inclination, the angle is calculated.

The first and second adjustment films 5 and 6 include Ti, TiN, TaN, or the like. When a film of such a metal or a compound is provided just below the metal film 2 or the metal part 3, the improvement of crystallinity, such as crystal orientation, crystal quality, and planarity can be expected. Note that the first and second adjustment films 5 and 6 can be omitted. In the case of omitting the first adjustment film 5, the metal film 2 is formed on the substrate 1. In the case of omitting the second adjustment film 6, the metal part 3 is formed on the metal film 2.

In the case where the metal part 3 has high electric resistance, a low-resistant member may be provided on the metal part 3 and the graphene wire 4 for the purpose of decreasing this resistance value. The low-resistant member may be Cu, Al, or the like.

According to this embodiment, with the multilayer and large-area graphene provided starting from the metal part 3, a low-resistant wire for the minute wire of 40 nm or less can be provided.

Example 1-1

Figure 7:
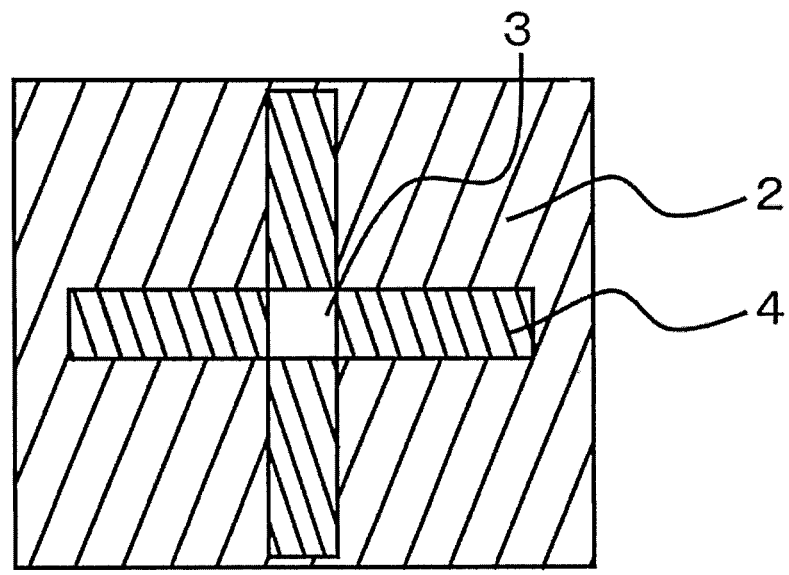
FIG. 7 is a schematic top view of a wire of an example 1-1.

Next, the wire in FIG. 1 is specifically described. Note that FIG. 7 is a top view of the wire of the example 1-1. The wire in FIG. 7 includes the substrate 1, the first adjustment film 5 provided on the substrate 1, the metal film 2 provided on the first adjustment film 5, the second adjustment film 6 embedded in a surface of a part of the metal film 2, the metal part 3 provided on the second adjustment film 6, and the graphene wire 4 connected to the metal film 2 and formed on the metal part 3. The graphene wire 4 is formed crosswise.

The first adjustment film is formed on the substrate 1. The formation method may be a CVD (Chemical Vapor Deposition) method or the like. Next, the metal film 2 is formed on the first adjustment film 5 by the CVD method or the like. The condition is optimized so that (111) plane of the metal film 2 is formed. Next, a region where the second adjustment film 6 is formed is created through a lithography technique, and the second adjustment film 6 is deposited. Next, the metal part 3 is formed on the metal film 2 and the second adjustment film by the CVD method or the like similarly. The metal part 3 is patterned through the lithography technique so as to remain in a square form in the center of the metal film 2. In order for the graphene wire 4 to grow crosswise, the metal part 3 is processed to form four-plane facets. After the metal part 3 is patterned, plasma treatment with hydrogen or the like, thermal treatment, or the like is performed to adjust so that the plane of the facet 7 is made smooth and the crystal orientation is made stable. The treatment using remote plasma is desirable; as the gas kind, $H_2$, $N_2$, Ar, or a mixture gas of those is preferable. The exposure treatment in which the substrate is directly exposed to plasma is also possible for the adjustment; in this case, however, it is likely that the facet formation is difficult to control. The treatment temperature is preferably 200° C. or more and the growth temperature or less.

The graphene wire 4 is formed by supplying a material obtained by decomposing a hydrocarbon compound such as ethylene or acetylene through thermal treatment or plasma treatment and by growing the multilayer graphene from the facet 7 of the metal part 3 by the CVD method or the like. At this time, the graphene growth easily occurs from other than the facet 7 at a treatment temperature of more than 600° C.; therefore, the treatment temperature is preferably 600° C. or less; After the graphene growth, an unnecessary part of any of the metal film 2, the metal part 3, and the graphene wire 4 may be removed.

Example 1-2

Figure 8:
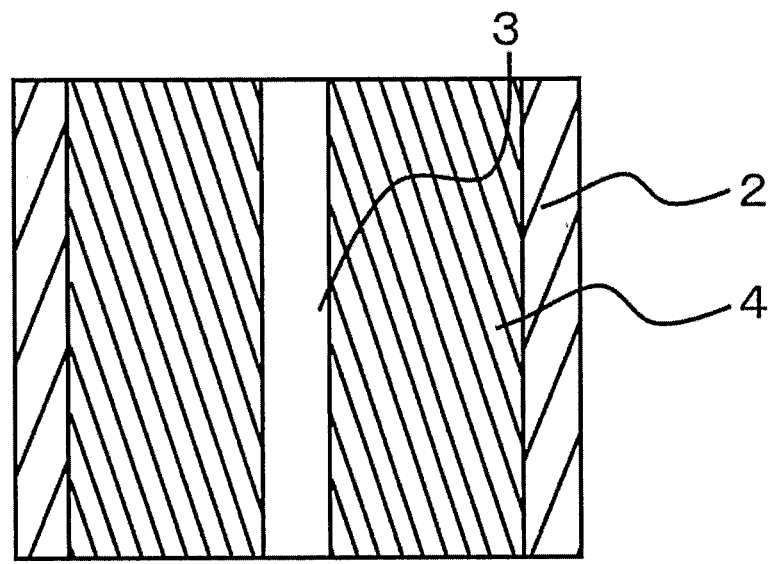
FIG. 8 is a schematic top view of a wire of an example 1-2.

A manufacturing method for a wire illustrated in the top view of FIG. 8 is described. The wire of this example is different from that of the example 1-1 in that the metal part 3 is formed vertically crossing the metal film and that the graphene wire 4 is formed widely in two directions.

The process of this example is similar to that of the example 1-1 except the lithography method for the metal part 3; the description is not repeated.

After the metal part 3 is formed by the CVD method or the like, patterning is performed so that the metal part 3 remains in a rectangular form vertically crossing the metal film 2 in the center of the metal film 2. The other process is similar to that of the example 1-1.

Example 1-3

Figure 9:
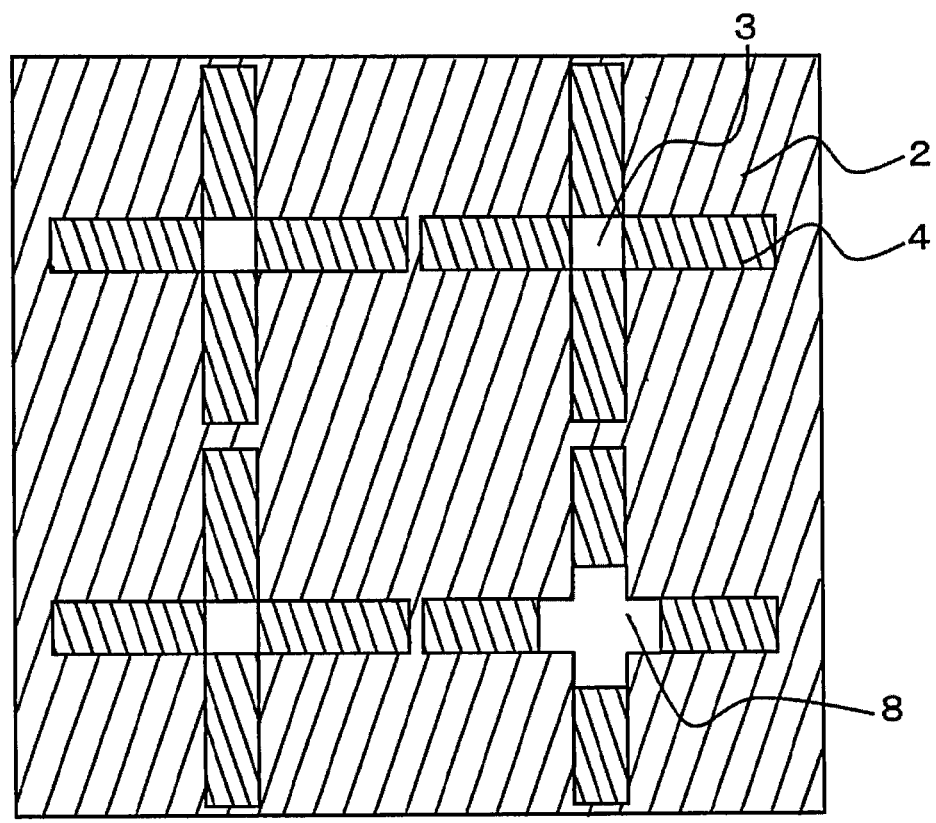
FIG. 9 is a schematic top view of a wire of an example 1-3.

A manufacturing method for a wire illustrated in the top view of FIG. 9 is described. The wire of this example is different from that of the example 1-1 in that a plurality of the wires of the example 1-1 are provided and that a part thereof is provided with a low-resistant member 8 covering a part of the graphene wire 4 and the metal part 3.

The process of this example is similar to that of the example 1-1 up to the step of growing graphene, except that a plurality of the metal parts 3 are formed. The different point from the example 1-1 is that after the graphene wire is grown, the low-resistant member 8 covering a part of the graphene wire 4 and the metal part 3 is formed by forming a mask, for example. Since the low-resistant member 8 is used, the influence of higher resistance due to the metal part 3 or the like can be relaxed.

Second Embodiment

Figure 10:
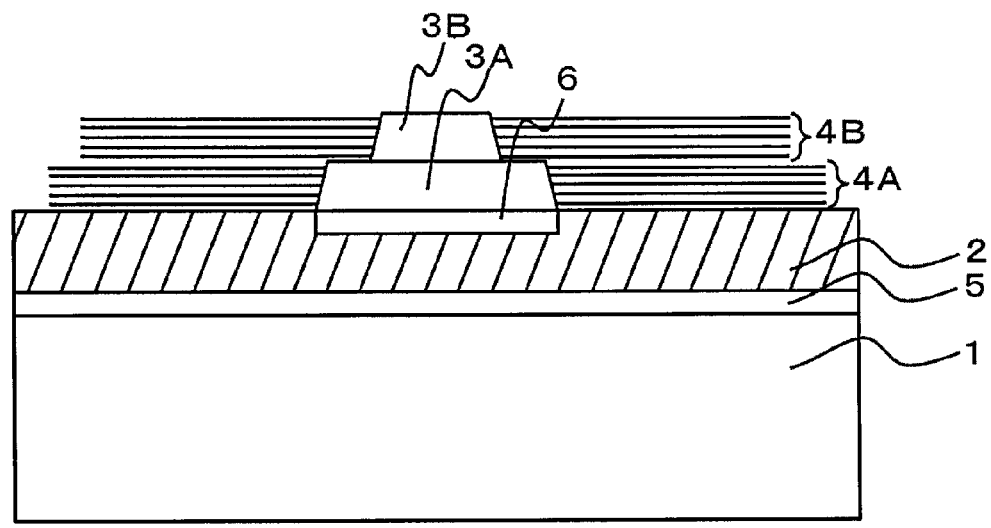
FIG. 10 is a schematic sectional view of a wire of a second embodiment.

FIG. 10 is a schematic sectional view of an example of a wire according to an embodiment. A wire of FIG. 10 includes the substrate 1, the first adjustment film 5 provided on the substrate 1, the metal film 2 provided on the first adjustment film 5, the second adjustment film 6 embedded in a surface of a part of the metal film 2, a first metal part 3A provided on the second adjustment film 6, a second metal part 3B formed on the first metal part 3A, and the graphene wire 4 electrically connected to the metal film 2 and formed on the metal part 3A and the metal part 3B.

The wire of the second embodiment is similar to that of the first embodiment except that the metal part includes two stages. The similar structure is not described. Multiple stages of the multilayer graphene wires are formed. Since overlapping displacement occurs in the graphene fabricated from the facets, the resistance is reduced.

Figure 11:
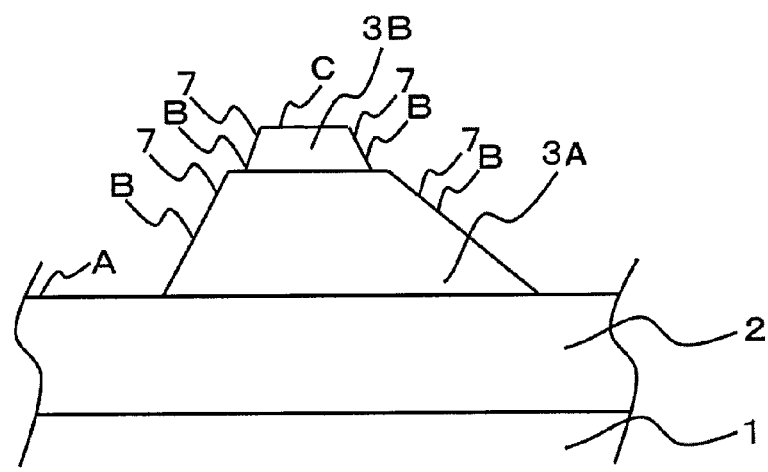
FIG. 11 is a schematic view of a part of a wire of the second embodiment.

FIG. 11 is a schematic view in which a part of the metal film 2 and the metal part 3 are extracted. In the metal part of FIG. 11, two stages of the first metal part 3A and the second metal part 3B are stacked. The different point from the first embodiment is that the number of stages is larger than that of the first embodiment, and the similar point with the first embodiment is the crystal orientation and the facet 7. The multiple stages of the metal part of FIG. 11 may be formed by forming guides that can be multiple stages and then forming the metal film, or by controlling the direction of etching or slimming the mask, for example.

Figure 12A:
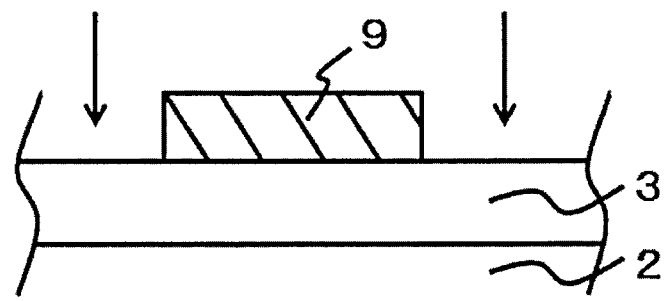
FIG. 12A is a process sectional view of a wire of the second embodiment.
Figure 12B:
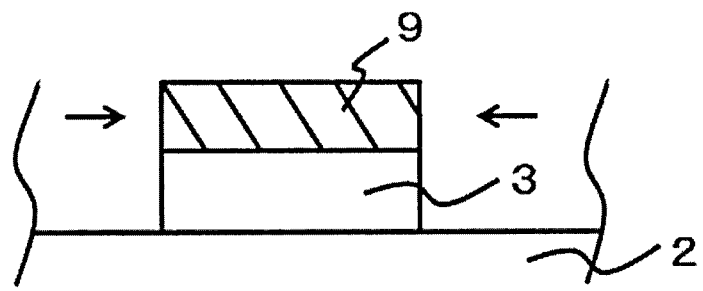
FIG. 12B is a process sectional view of the wire of the second embodiment.
Figure 12C:
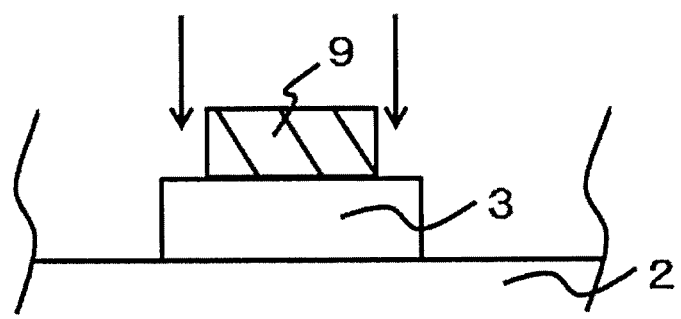
FIG. 12C is a process sectional view of the wire of the second embodiment.
Figure 12D:
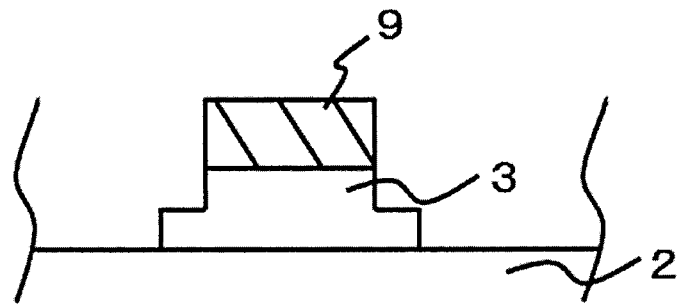
FIG. 12D is a process sectional view of the wire of the second embodiment.
Figure 12E:
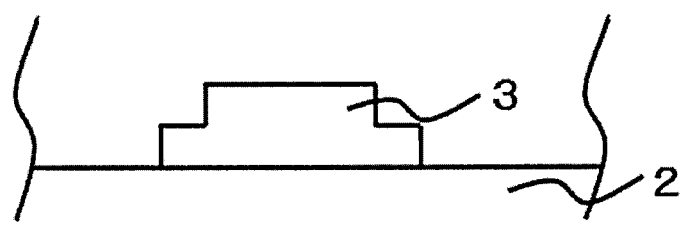
FIG. 12E is a process sectional view of the wire of the second embodiment.
Figure 12F:
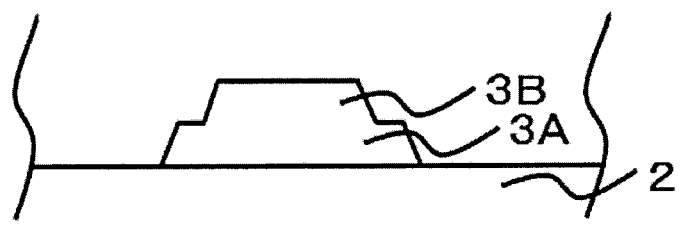
FIG. 12F is a process sectional view of a wire of the second embodiment.

An example of a method of forming the multiple stages is specifically described using the process sectional views of FIGS. 12A to 12F. A mask 9 is formed and the metal part 3 is patterned (FIG. 12A). Then, the mask 9 is side-etched to slim the mask 9 (FIG. 12B). Etching is performed so that a part of the metal part 3 remains (FIG. 12C). The mask 9 is removed (FIG. 12D). The metal part 3 is subjected to plasma treatment or thermal treatment (FIG. 12E), and thus, the multiple stages of the metal parts 3A and 3B illustrated in FIG. 12F are formed. For further increasing the number of stages by this method, the slimming and etching may be repeated.

Example 2-1

Figure 13:
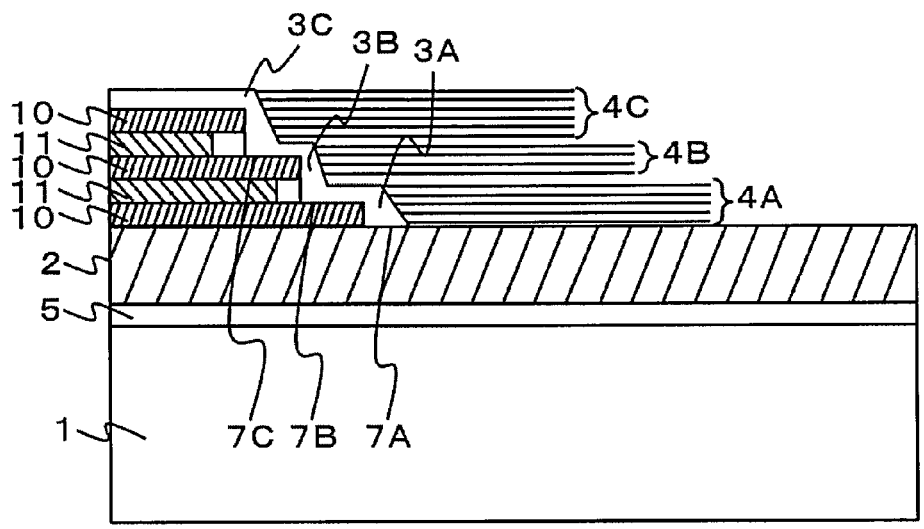
FIG. 13 is a schematic sectional view of the wire of the second embodiment.
Figure 14:
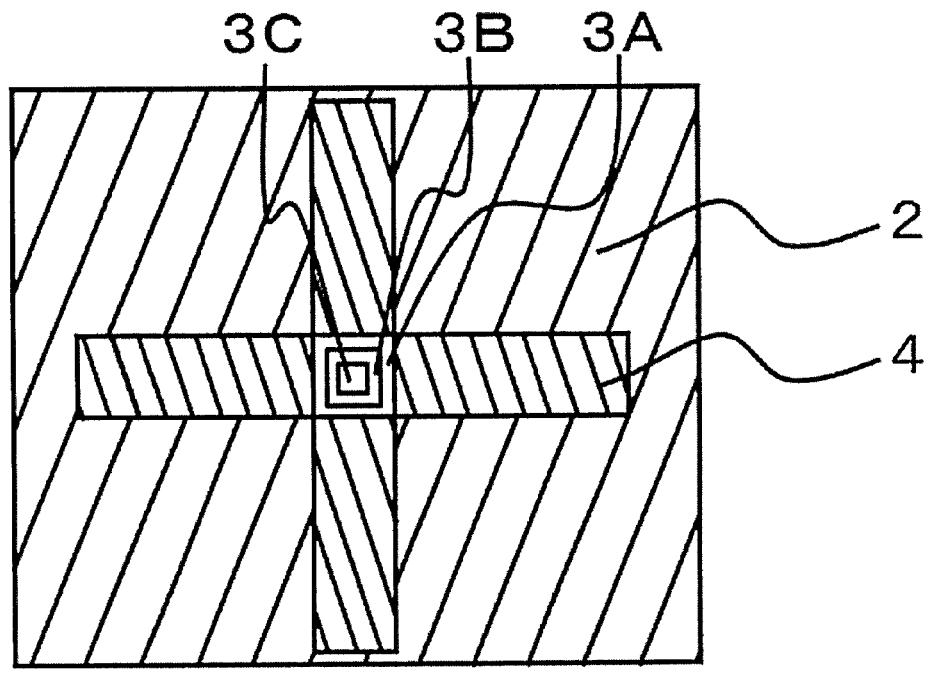
FIG. 14 is a schematic top view of the wire of the second embodiment.

Next, a wire illustrated in the schematic sectional view of FIG. 13 is specifically described. FIG. 14 is a top view thereof. Since many parts and steps of this example are common with those of the example 1-1, the description on the common parts and steps is omitted.

The wire of FIG. 13 includes the substrate 1, the first adjustment film 5 provided on the substrate 1, the metal film 2 provided on the first adjustment film 5, three stages of metal parts 3A, 3B, and 3C provided on the metal film 2, and graphene wires 4A, 4B, and 4C electrically connected to the metal film 2 and formed on the metal part 3A, the metal part 3B, and the metal part 3C, respectively. Although the wire sectional view of FIG. 13 illustrates only one side, the graphene can be grown in a desired wire direction.

In the example 2-1, two kinds of insulation films 10 and 11 with different etching rates are stacked with different widths as guides for forming the multiple stages of the metal parts 3. For example, the two kinds of layers may be a $SiO_2$ film and a SiN film 11. Using these stacked films 10 and 11 as the guides, the three stages of the metal parts 3A, 3B, and 3C are formed. These metal parts 3A, 3B, and 3C are provided with facets 7A, 7B, and 7C. The facets 7A, 7B, and 7C are inclined surfaces satisfying preferable conditions described in the first embodiment; for example, the facets 7A, 7B, and 7C have preferable crystal orientation described in the first embodiment. The graphene wires 4A, 4B, and 4C are formed from the stages of the facets.

Figure 15A:
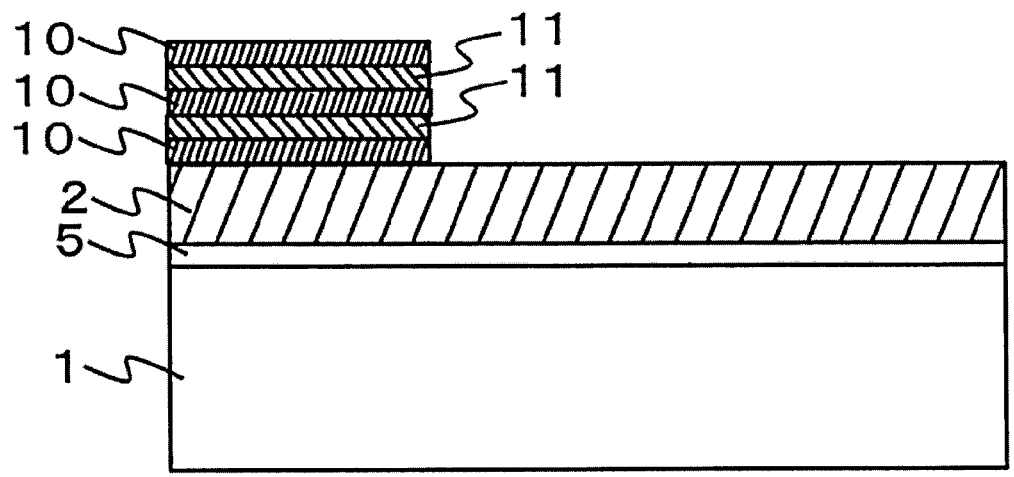
FIG. 15A is a process sectional view of the wire of the second embodiment.
Figure 15B:
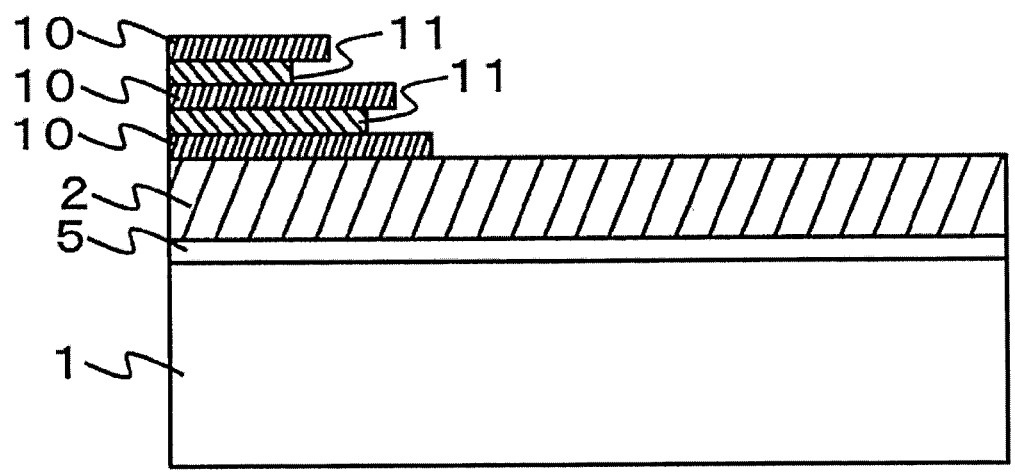
FIG. 15B is a process sectional view of the wire of the second embodiment.

With reference to the process sectional view of FIGS. 15A and 15B, a method of forming the stacked layer of the $SiO_2$ film and the SiN film 11 and the three stages of the metal parts 3A, 3B, and 3C is described. The others are the same as those of the example 1-1.

The $SiO_2$ film 10 and the SiN film 11 are sequentially deposited and stacked on the metal film (FIG. 15A). The film thickness of the insulation film is controlled on the order of nanometers by ALD (Atomic Layer Deposition) or the like. Next, the insulation film is processed to have a step-like structure on the order of nanometers so as to be tapered through RIE (Reactive Ion Etching) (FIG. 15B). Next, the metal parts 3 are deposited on the step-like structure, and etching is performed so that the multiple stages of the metal parts 3A, 3B, and 3C remain, and then, plasma treatment or thermal treatment is performed. After that, the multiple stages of the graphene wires 4A, 4B, and 4C are grown. Thus, even though the graphene wires are in multiple stages, graphene can be formed in a growth process similar to that for forming graphene in one stage. Because of having the multiple stages, further resistance reduction is possible as described above.

Third Embodiment

The third embodiment relates to a semiconductor device including a graphene wire.

A part of the feature of a wire layer of the third embodiment is the same as that of the wire of the first and second embodiments. A bottom face and a side face of the wire layer are based on a trench. The angle of the facet is the angle between the facet and the substrate.

Example 3-1

Figure 16:
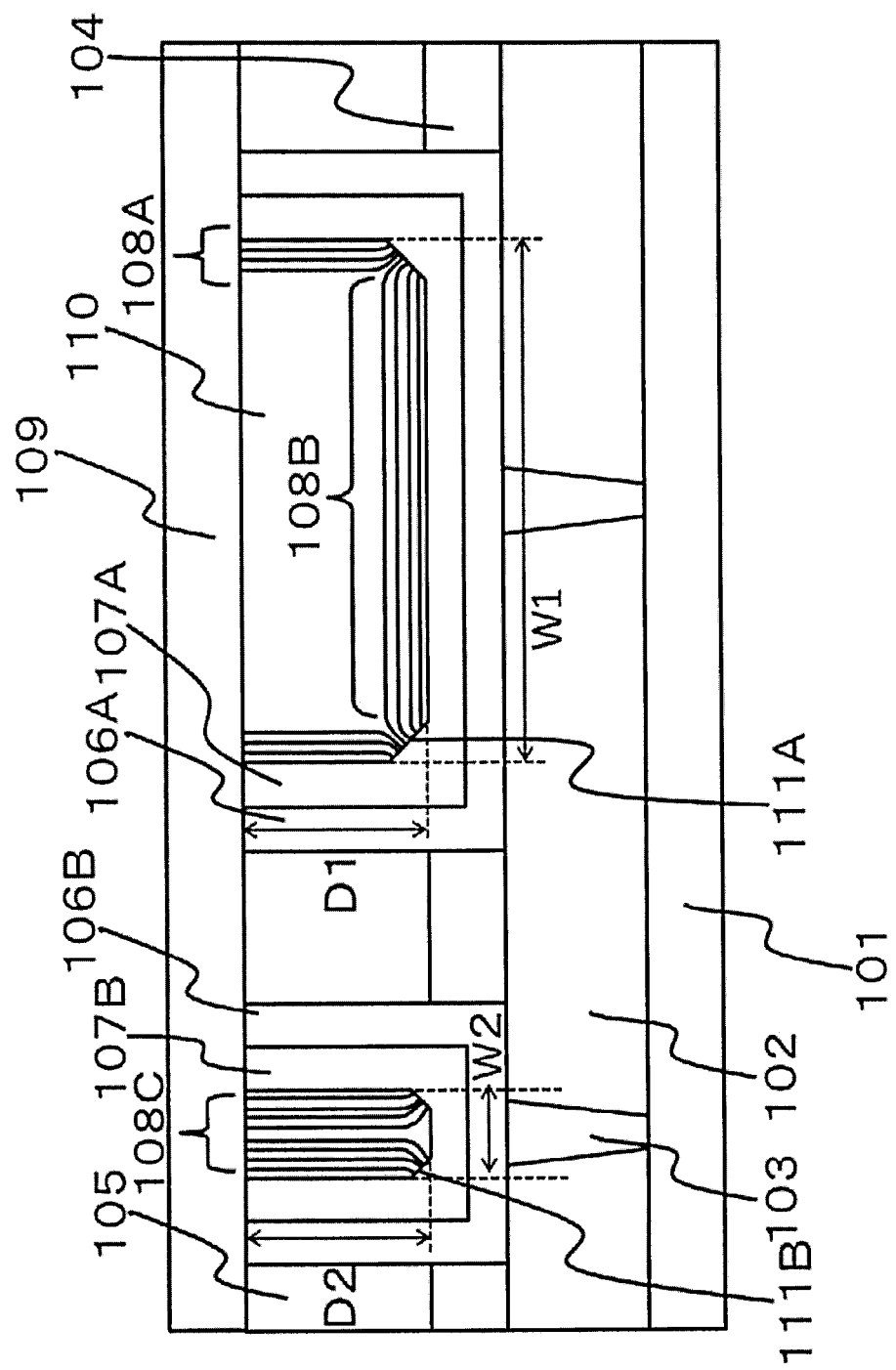
FIG. 16 is a schematic sectional view of a semiconductor device including a wire of a third embodiment.

A semiconductor device having a wire illustrated in the schematic view of FIG. 16 according to this example includes a substrate 101, a contact layer 102 formed on the substrate 101, a wire layer formed on the contact layer 102, and a protective layer 109 on the wire layer. The wire layer has insulation films 104 and 105 stacked thereon, and trenches penetrating through these insulation films are formed. In the trenches, catalyst films (107A and 107B) and graphene wires (108A, 108B, and 108C) are provided. The graphene wire includes facets 111A and 111B of the catalyst layer. A space in the trench may be provided with an insulation film or a metal film 110. The use of the formed metal film would contribute to the electron conduction of the wire, thereby further reducing the wire resistance. The contact layer 102 is provided with an interlayer wire 103 that connects the wire layer and a non-depicted element on the substrate 101. Adjustment films (106A and 106B) for improving the crystallinity of the catalyst film may be formed between the interlayer wire 103 and the catalyst film.

An example of a manufacturing method for a semiconductor device is described with reference to the schematic view of FIG. 16 and the process sectional view of the third embodiment illustrated in FIG. 17 to FIG. 19.

In the manufacturing method for the semiconductor device, hydrocarbon is supplied to a member having a catalyst film having a facet formed in a trench, and graphene can be grown at a temperature of 600° C. or less. The facet of the catalyst film is formed by hydrogen plasma treatment, thermal treatment, or the like. The catalyst film is processed into a step-like structure by using a step-like structure member as a guide and by forming the step-like structure catalyst film or by etching the catalyst film, for example, and the aforementioned facet is processed to form the multiple stages of the facets.

Figure 17:
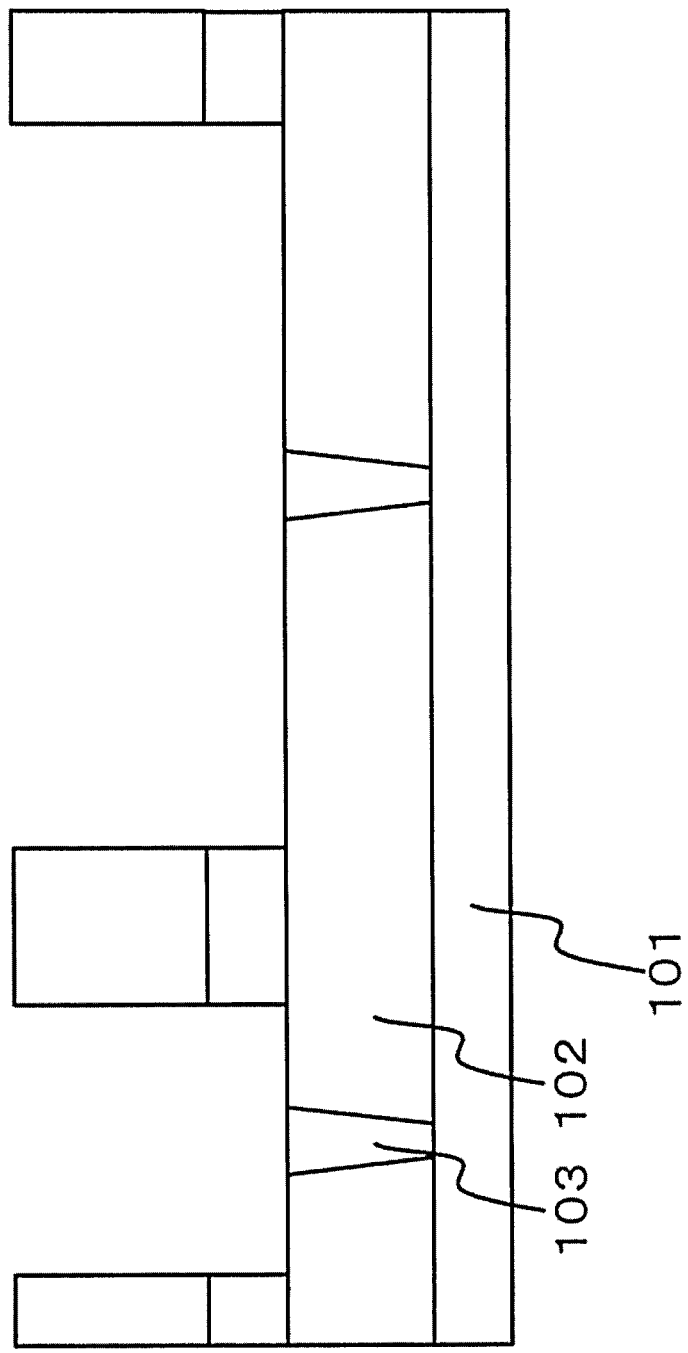
FIG. 17 is a schematic sectional view of the semiconductor device including the wire of the third embodiment.

FIG. 17 illustrates the steps of forming the contact layer 102 including the interlayer wire 103 on the substrate 101 and forming narrow and wide trenches for damascene wires on the contact layer and the member on which a silicon nitride film 104 and the insulation film 105 are stacked. The trench is formed by, for example, applying resist, processing the resist into a mask through a lithography step, and performing RIE processing. For the insulation film 105, for example, TEOS (Tetraethyl orthosilicate) or the like can be used. The narrow trench has a graphene wire width of 30 nm or less. The wide trench has a graphene wire width of more than 30 nm. The trench may be formed widely or narrowly depending on the purpose; only one of the wide and narrow trenches might be formed depending on the semiconductor device. This does not exclude an embodiment in which a trench with an intermediate width between the narrow trench and the wide trench is formed and the graphene wire is formed in the trench.

Figure 18:
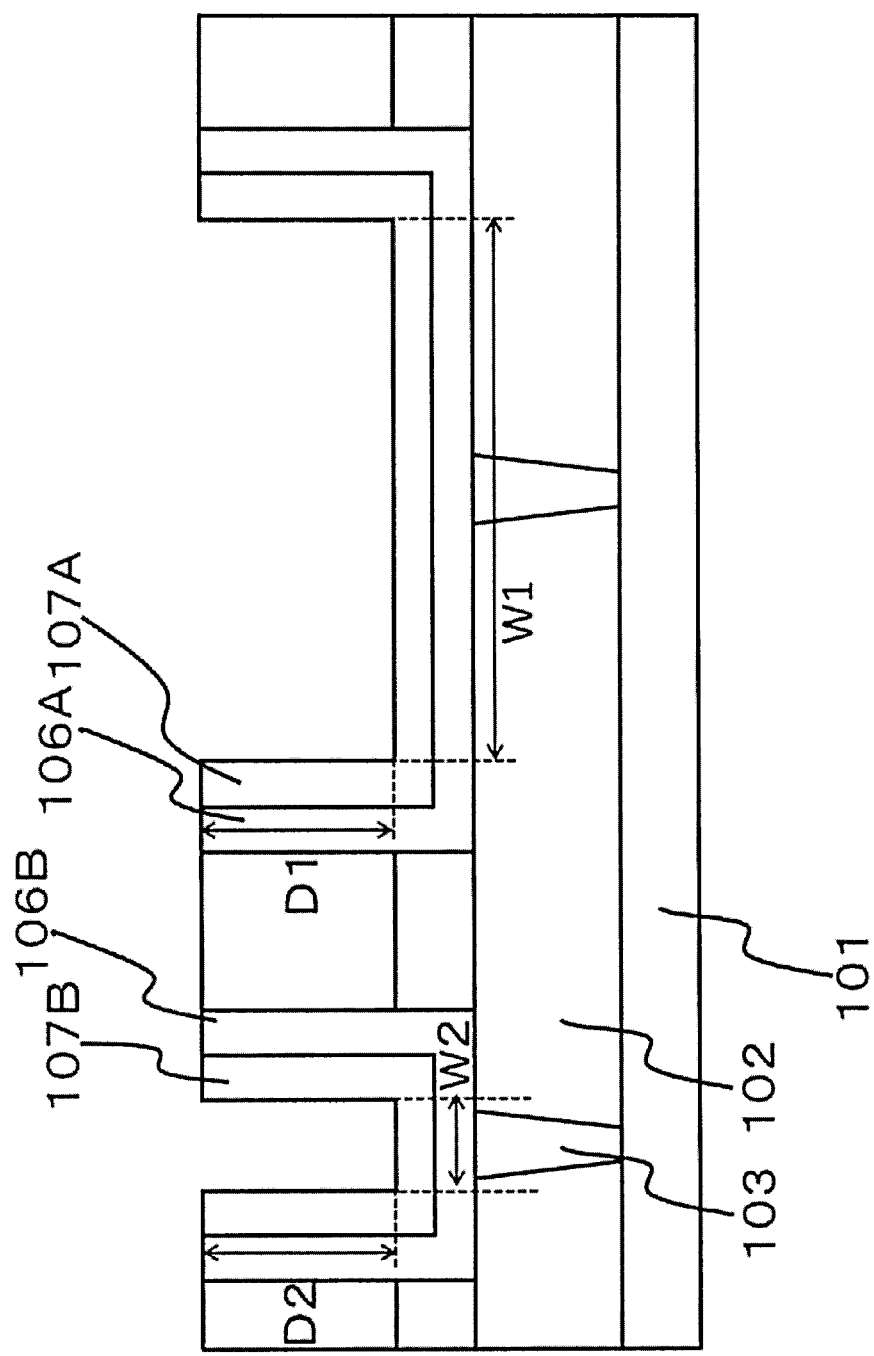
FIG. 18 is a process sectional view of the semiconductor device including the wire of the third embodiment.

FIG. 18 illustrates the steps of forming the adjustment film in the trench of the member provided with the trench and on the insulation film 105, forming the catalyst film on the adjustment film, forming a sacrifice film on the catalyst film, performing planarization processing on the adjustment film, the catalyst film, and the sacrifice film through CMP (Chemical Mechanical Polishing) or the like, and removing the sacrifice film by ashing or wet processing, thereby forming the adjustment films 106A and 106B and the catalyst films 107A and 107B. The adjustment films 106A and 106B are similar to the adjustment films described in the first and second embodiments. The catalyst films 107A and 107B are similar to the metal parts described in the first and second embodiments. The planarization is performed so that the adjustment films and the catalyst films remain as illustrated in FIG. 18. As the sacrifice film, a material with excellent workability and high selectivity in ashing or the like, for example an organic film or the like, can be used.

FIG. 18 shows the wire widths (W1 and W2) and the wire depths (D1 and D2). The wide trench has a wire width of W1 and a wire depth of D1. The aspect ratio of the minute wire in the wide trench, D1/W1, is 0.5 or less. The narrow trench has a wire width of W2 and a wire depth of D2. The aspect ratio of the minute wire in the narrow trench, D2/W2, is 2 or more. In the case where the catalyst film has a multistage structure, the mean value of the width of the minute wire is the wire width. In the graphene wire with a wire depth/wire width of 0.5 or less, graphene extending in the wire depth direction serves as a main path of electric conduction. In the graphene wire with a wire depth/wire width of 2 or more, graphene extending in the wire width direction serves as a main path of electric conduction.

Figure 19:
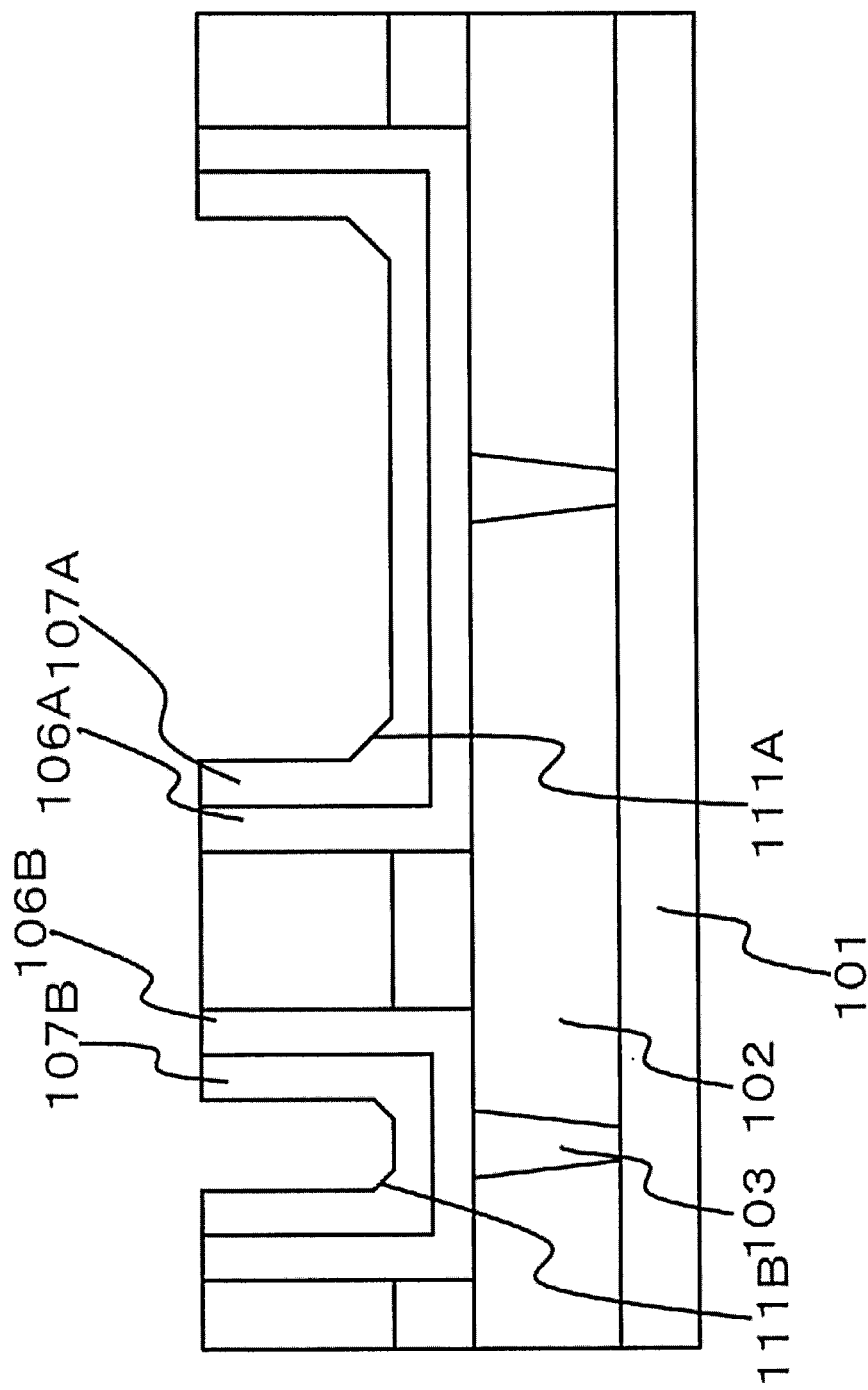
FIG. 19 is a process sectional view of the semiconductor device including the wire of the third embodiment.
Figure 20:
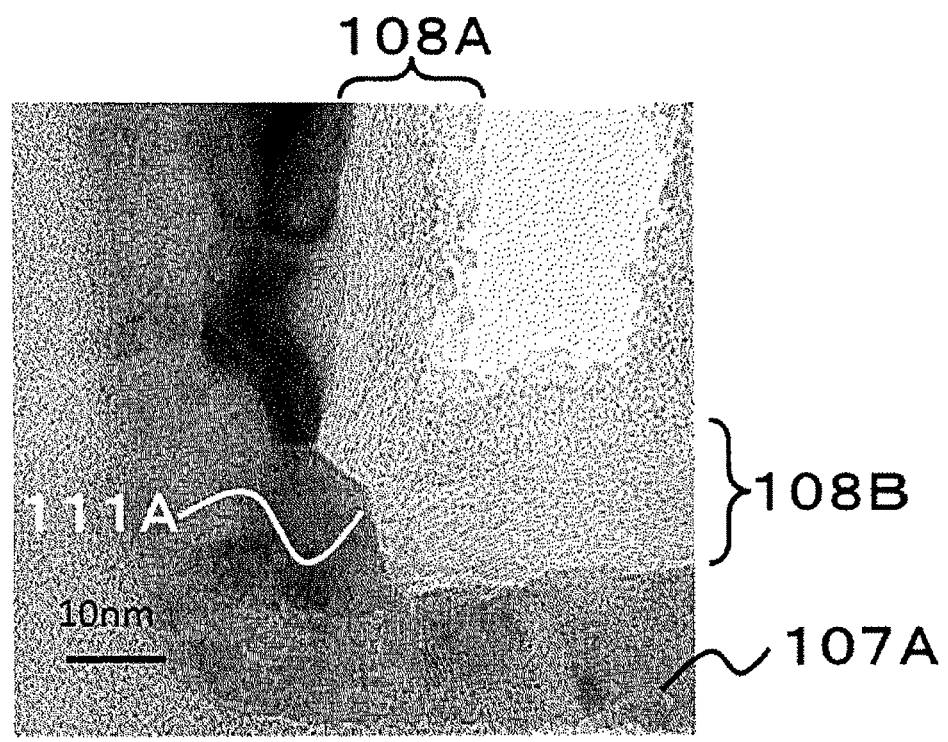
FIG. 20 is a TEM image of a graphene wire.

FIG. 19 depicts the step of forming the facets 111A and 111B by performing plasma treatment or thermal treatment on the catalyst films 107A and 107B of the member of FIG. 18. This is similar to the first and second plasma treatment or thermal treatment. The facets in the third embodiment are similar to those of the first and second embodiments. FIG. 20 is a TEM image of the graphene wire on the wide side of the example 3-1.

Carbon is supplied to the member of FIG. 19 and thermal treatment or the like is performed, so that a multilayer graphene wire is grown from the facets 111A and 111B in a manner similar to the first and second embodiments. As is clear from the TEM image of FIG. 20, on the wide minute wire side, a side face and a bottom face of the catalyst film 107A serve as guides and graphene wires 108A and 108B are grown along the guides. The graphene wire 108B grows from the both ends and the both are united in the center. On the narrow minute wire side, a side face of the catalyst film 107B serves as a guide and the graphene wire 108C is grown along the guide in a direction of an opening of the trench. When the trench has a small depth, growth of graphene along the side face as the guide might not occur. Since the bottom width of the catalyst film 107B is narrow in the narrow minute wire, no or almost no graphene wires grow along the bottom face as the guide. An insulation film is formed in the trench as necessary, and then the unnecessary graphene wire is removed. Moreover, the protective layer 109 is formed; then, the semiconductor device of FIG. 16 is obtained.

As the semiconductor device of the third embodiment, the semiconductor device whose extension direction of the graphene wire is controlled can be obtained just by adjusting the wire width of the minute wire. When the graphene is extended toward the bottom face of the catalyst film in the narrow trench, the lattice number of crystal unit with respect to the graphene extension direction is reduced, resulting in that the graphene wire might have high resistance or the graphene wire itself might behave like the semiconductor. However, in the third embodiment, since the extension direction of the graphene wire can be controlled, such a problem with the graphene wire can be suppressed.

Example 3-2

Figure 21:
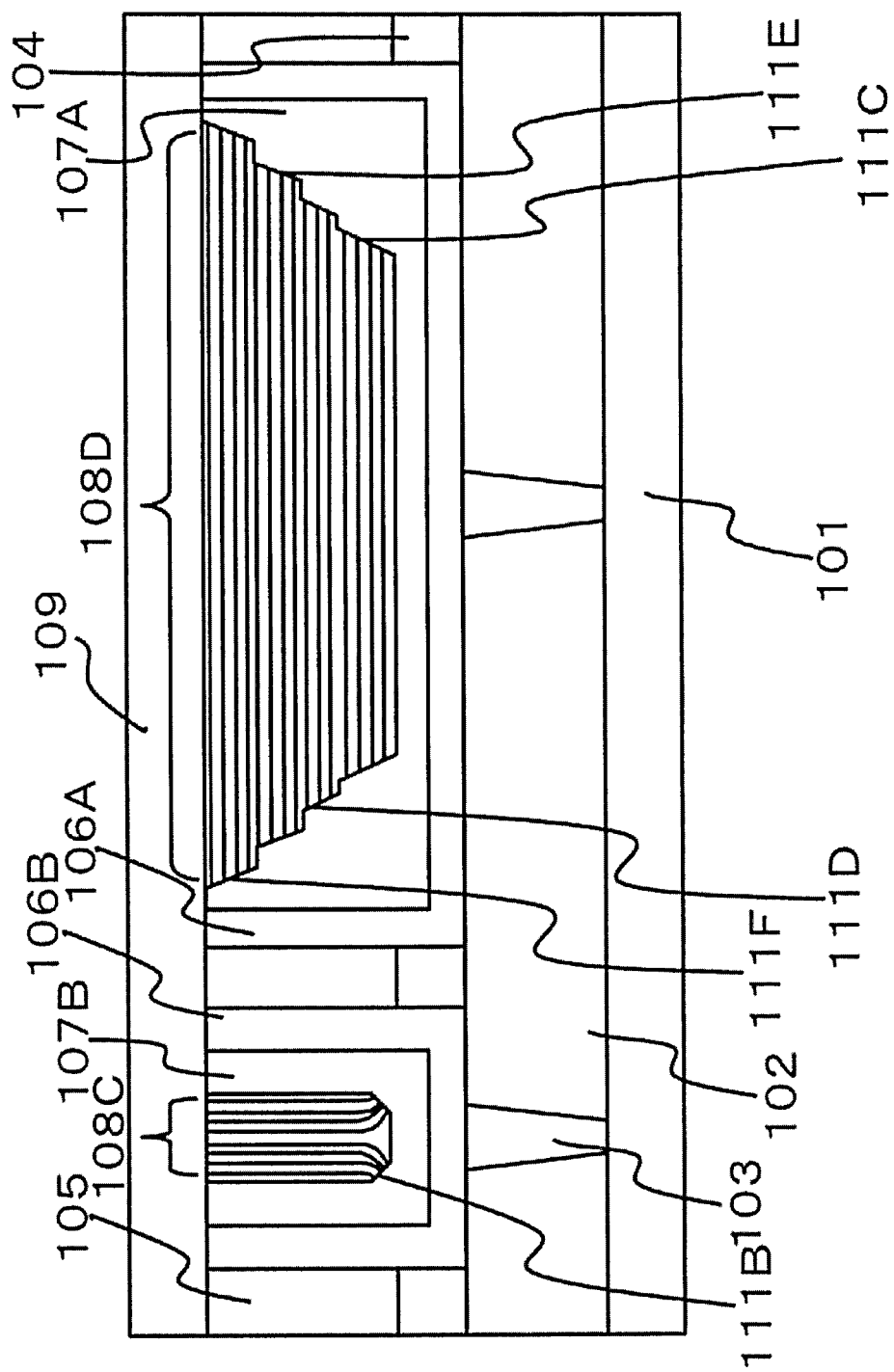
FIG. 21 is a schematic sectional view of the semiconductor device including the wire of the third embodiment.

FIG. 21 depicts a semiconductor device according to the example 3-2. The example 3-2 is similar to the example 3-1 except that the catalyst film 107A is formed in multiple stages and one of them is provided with four-plane facets 111C, 111D, 111E, and 111F, that a graphene wire 108D is formed within the minute wire on the wide side, and that a space (insulation film) like that in the example 3-1 is not provided. In a manufacturing method for the semiconductor device of this example, the step of forming the metal part of the multiple stages according to the second embodiment may be employed for processing the catalyst film 107A.

In the semiconductor device of this example 3-2, just by making the catalyst film 107A in multiple stages, the graphene wire 108D extending in a direction along the bottom face of the catalyst film 107A can be obtained even above the inside the trench of the minute wire on the wide side. Because of forming the catalyst film 107A in multiple stages, the thickness of the graphene wire 108D can be made larger than that of the graphene wire 108B formed in the example 3-1. By forming the graphene wire 108D to be thick, the wire resistance can be reduced, the wire current density can be relaxed, and the wire reliability can be improved.

Example 3-3

Figure 22:
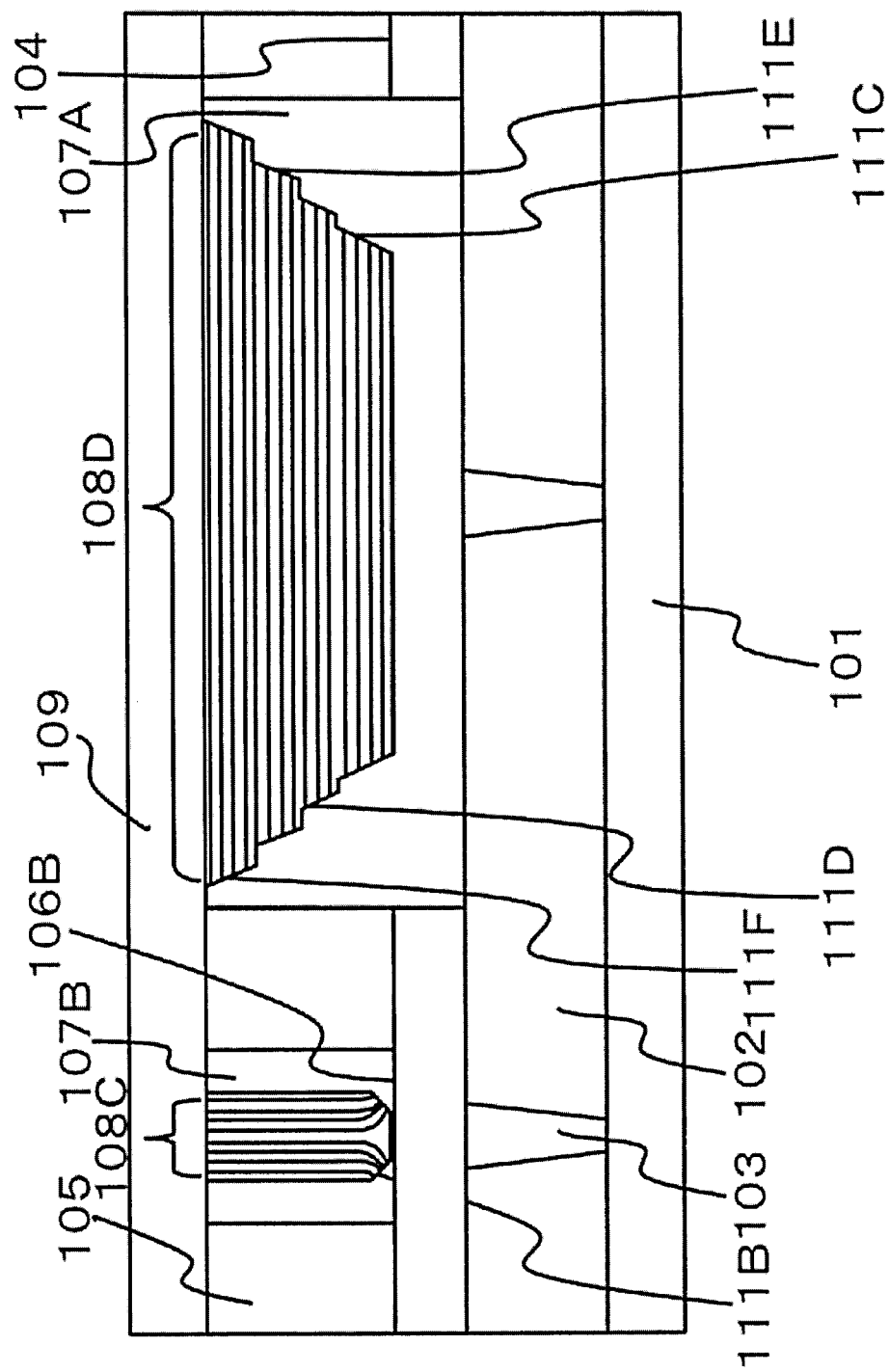
FIG. 22 is a schematic sectional view of the semiconductor device including the wire of the third embodiment.

FIG. 22 depicts a semiconductor device according to the example 3-3. The example 3-3 is similar to the example 3-2 except that the side-face sides of the adjustment film 106A and the adjustment film 106B are omitted. A manufacturing method for the semiconductor device according to this example is similar to that of the example 3-2 except that the adjustment film 106B is formed only at the bottom part of the trench on the narrow side in the example 3-1.

Since a part of the adjustment film is omitted in the example 3-3, the wire resistance can be further reduced. Moreover, since the adjustment film is reduced as compared with the example 3-2, the minute wire on the narrow side can achieve further miniaturization of wires.

Example 3-4

Figure 23:
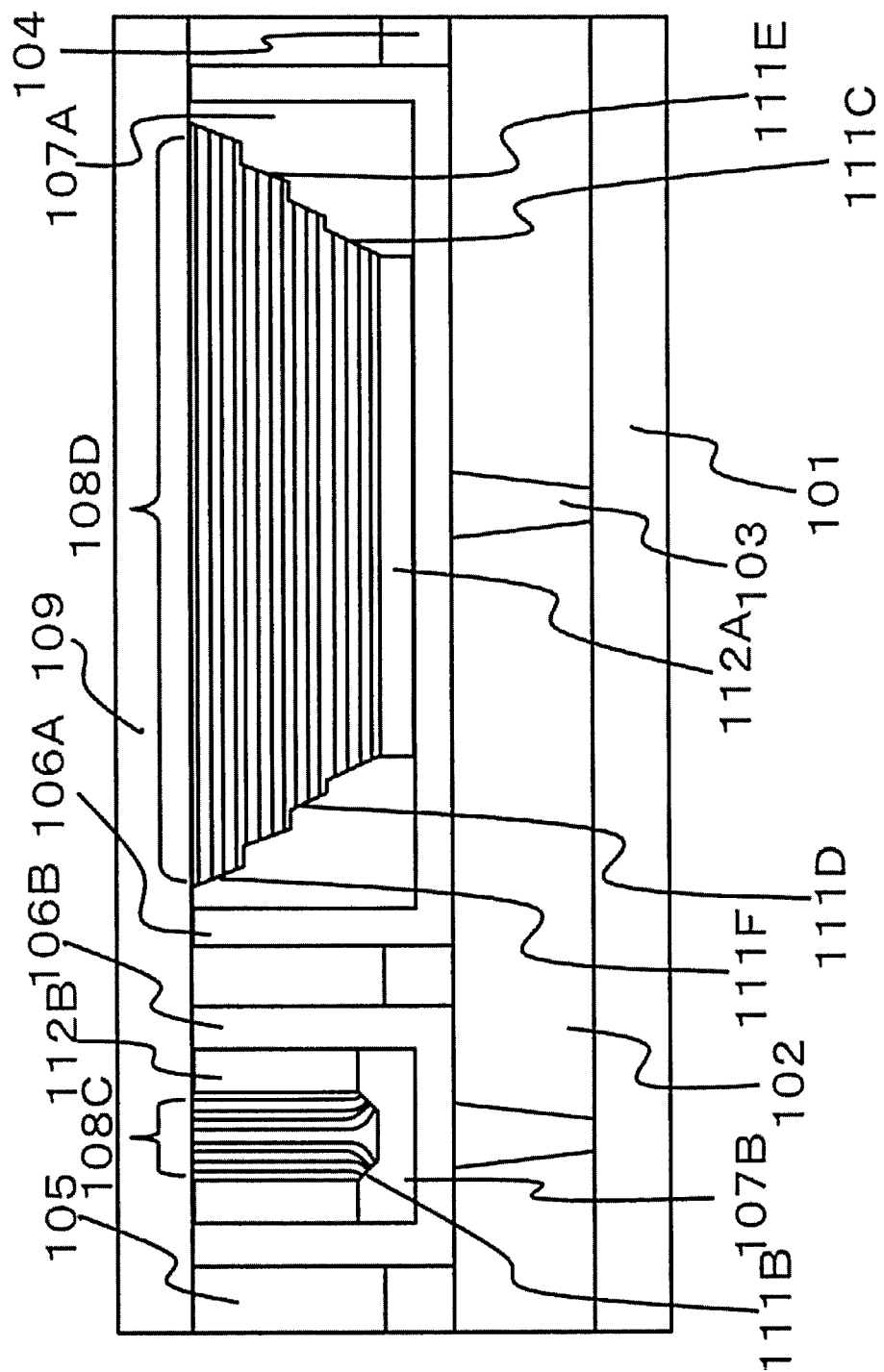
FIG. 23 is a schematic sectional view of the semiconductor device including the wire of the third embodiment.

FIG. 23 depicts a semiconductor device according to the example 3-4. The example 3-4 is similar to the example 3-2 except that a metal film 112A at a bottom face of the catalyst film 107A and a metal film 112B at a side face of the catalyst film 107B are formed instead of the catalyst film. The metal films 112A and 112B are formed in a direction where graphene extends in the graphene wire. The metal films 112A and 112B of this example 3-4 are similar to the metal films of the first and second embodiments, and the relation between the metal film and the metal part in the first and second embodiments is similar to the relation between the metal film and the catalyst film of the example 3-4.

In the example 3-4, the metal film suitable for the formation of the large-area graphene is formed in the direction where graphene extends; therefore, the graphene wire can have a large area and the wire can have higher reliability, which is preferable.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate;
   a contact layer formed on the semiconductor substrate;
   a wire layer formed on the contact layer; and
   a protective layer formed on the wire layer,
   wherein the wire layer is provided with a trench,
   a catalyst film is formed in the trench,
   graphene wires are provided with the catalyst film,
   the graphene wires have a ratio of a wire depth to a wire width, wire depth/wire width, of 0.5 or less or 2 or more, or one of the graphene wires has a wire depth/wire width of 0.5 or less and the other has a wire depth/wire width of 2 or more,
   the graphene wire with a wire depth/wire width of 2 or more has a wire width of 30 nm or less, and
   the graphene wire with a wire depth/wire width of 0.5 or less has a wire width of more than 30 nm.

2. The semiconductor device according to claim 1, wherein
   graphene of the graphene wire with a wire depth/wire width of 2 or more which extends in a wire depth direction serves as a main path of electric conduction, and graphene of the graphene wire with a wire depth/wire width of 0.5 or less which extends in a wire width direction serves as a main path of electric conduction.

3. The semiconductor device according to claim 1, wherein the graphene wire with a wire depth/wire width of 2 or more and the graphene wire with a wire depth/wire width of 0.5 or less are formed at the same time.

4. The semiconductor device according to claim 1, wherein the catalyst film includes a metal selected from the group including Ni, Co, Fe, Ru, and Ti, or an alloy including two or more kinds of metals selected from the group.

5. The semiconductor device according to claim 1, wherein
the graphene wire includes a facet of the catalyst film, and
the facet includes either a (110) plane or a (100) plane.

6. The semiconductor device according to claim 5, comprising a plane at which an angle between the facet and the catalyst film is 20° or more and 70° or less.

7. The semiconductor device according to claim 5, wherein the facet provided for the catalyst film has multiple stages.

8. The semiconductor device according to claim 1, wherein a metal film including Cu or an alloy including Cu is provided for a side face or a bottom face of the trench of the catalyst film.

9. The semiconductor device according to claim 1, wherein
the graphene wire includes a facet of the catalyst film;
the facet includes either a (110) plane or a (100) plane; and
a bottom corner of the trench includes the facet including either the (110) plane or the (100) plane.

* * * * *